United States Patent [19]

Fang et al.

[11] Patent Number: 4,567,640

[45] Date of Patent: Feb. 4, 1986

[54] METHOD OF FABRICATING HIGH DENSITY CMOS DEVICES

[75] Inventors: Robert C. Y. Fang; Jerry S. H. Wang, both of Cupertino, Calif.

[73] Assignee: Data General Corporation, Westboro, Mass.

[21] Appl. No.: 612,927

[22] Filed: May 22, 1984

[51] Int. Cl.[4] .......................................... H01L 21/265
[52] U.S. Cl. ................................. 29/571; 29/576 B; 29/578; 148/187
[58] Field of Search .................... 29/571, 576 B, 578; 148/187

[56] References Cited

U.S. PATENT DOCUMENTS

| | | | |
|---|---|---|---|
| 3,983,620 | 10/1976 | Spadea | 29/571 |
| 4,013,484 | 3/1977 | Boleky et al. | 148/187 X |
| 4,043,025 | 8/1977 | Spadea | 29/571 |
| 4,045,259 | 8/1977 | Sanders | 148/188 |
| 4,047,284 | 9/1977 | Spadea | 29/578 X |
| 4,131,907 | 12/1978 | Ouyang | 357/42 |
| 4,135,955 | 1/1979 | Gasner et al. | 148/187 |
| 4,143,388 | 3/1979 | Esaki et al. | 357/23 |
| 4,152,717 | 5/1979 | Satou et al. | 357/42 |
| 4,183,134 | 1/1980 | Oehler et al. | 29/571 |
| 4,282,648 | 8/1981 | Yu et al. | 29/571 |
| 4,295,266 | 10/1981 | Hsu | 29/571 |
| 4,306,916 | 12/1981 | Wollesen et al. | 148/187 X |
| 4,314,857 | 2/1982 | Aitken | 148/187 X |
| 4,335,504 | 6/1982 | Lee | 29/576 B |
| 4,372,033 | 2/1983 | Chiao | 29/571 |
| 4,373,253 | 2/1983 | Khadder et al. | 29/576 B |
| 4,376,336 | 3/1983 | Endo et al. | 29/571 |
| 4,382,827 | 5/1983 | Romano-Moran et al. | 148/187 X |
| 4,385,947 | 5/1983 | Halfacre et al. | 148/187 |
| 4,391,650 | 7/1983 | Pfeifer et al. | 29/571 X |
| 4,406,710 | 9/1983 | Davies et al. | 29/576 B |
| 4,409,726 | 10/1983 | Shiota | 148/187 X |
| 4,412,375 | 11/1983 | Matthews | 29/571 |
| 4,420,872 | 12/1983 | de Zaldivar | 29/578 X |
| 4,450,021 | 5/1984 | Batra et al. | 29/571 |

*Primary Examiner*—George T. Ozaki
*Attorney, Agent, or Firm*—Limbach, Limbach & Sutton

[57] ABSTRACT

A method of forming CMOS transistors with self-aligned field regions comprising the steps of providing on a silicon substrate first and second spaced apart areas for said CMOS transistors followed by forming a masking member on said substrate protecting the first of said areas and exposing the second. The second area is doped with a p-type material after which the size of the unmasked area is increased to that defining a p-well region to be formed therein surrounding said second area. Once the p-well region is formed, the same mask is employed to dope the p-well region with additional p-type material after which the CMOS transistors are fabricated in said first and second spaced apart areas.

13 Claims, 8 Drawing Figures

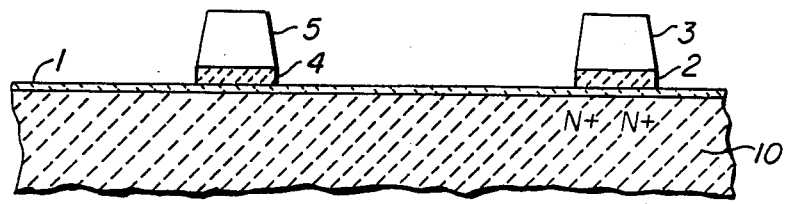
FIG._1.
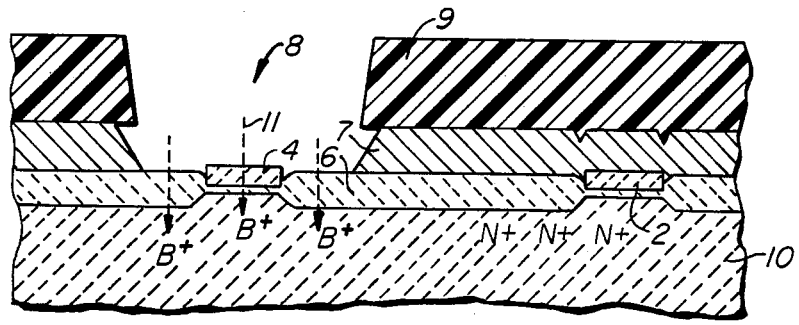
FIG._2.
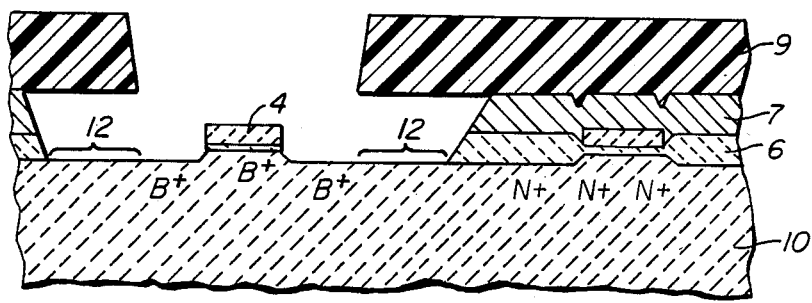
FIG._3.
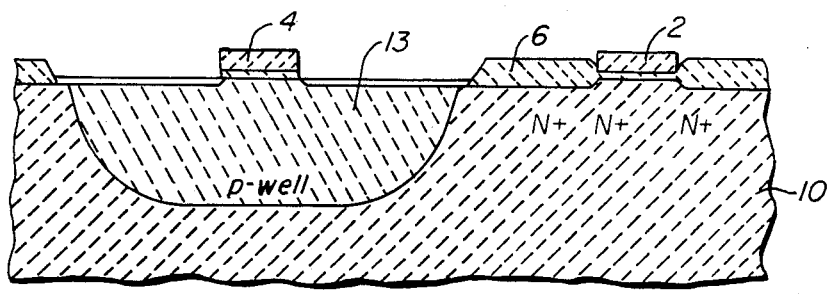
FIG._4.

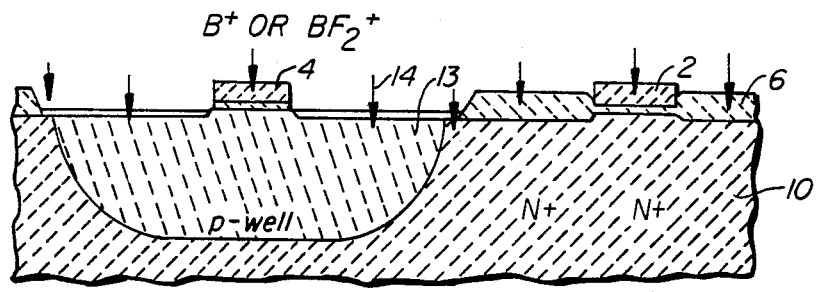
FIG._5.
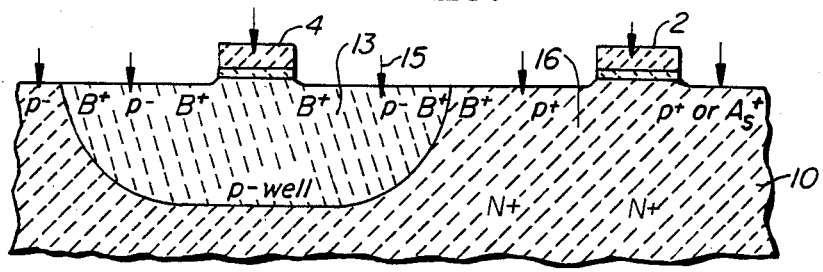
FIG._6.
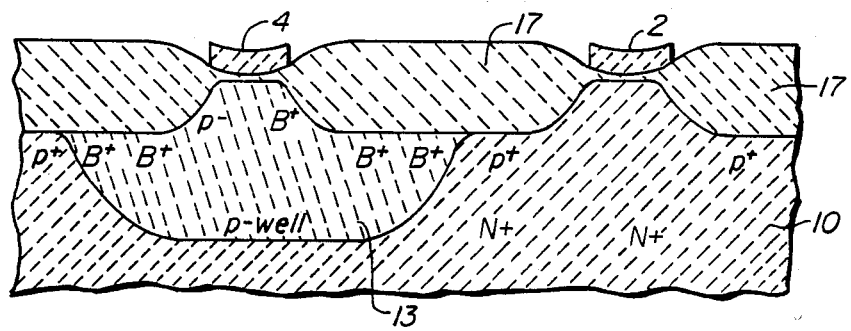
FIG._7.
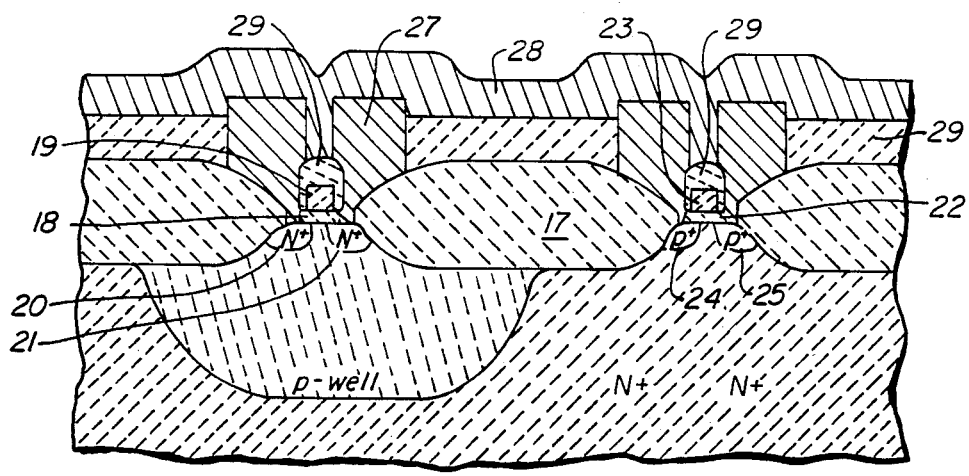
FIG._8.

METHOD OF FABRICATING HIGH DENSITY CMOS DEVICES

DESCRIPTION

1. Technical Field of Invention

Disclosed herein is a new method for fabricating CMOS transistors with self-aligned field regions. The self-aligned field regions are achieved without using any additional masking steps other than the mask required to form the well-known p-well region. By employing the method taught herein, a minimum of space is needed to separate n-channel and p-channel transistors resulting in a chip size reduction heretofore unachievable.

2. Background of the Invention

CMOS field-effect transistors exhibit the characteristics of high switching speeds and high noise immunity over a wide range of power supply voltages. As such, they are commonly used in such devices as wrist watches, hand-held calculators and in other environments where low power consumption is desirable.

In the past, high voltage CMOS devices have used field oxides and densely doped substrates and wells to reduce leakage between neighboring active MOS areas. But such devices generally exhibit unsatisfactory AC performance, as such devices exhibit high threshold voltages and high capacitance.

In order to reduce leakage problems without employing thick field oxides and heavily doped substrates, others have proposed various full channel stops spaced apart from the active devices which they surround. Techniques, such as ion implantation, are employed requiring rather complex processing conditions involving a number of masking steps in addition to those required in the formation of the active devices. As such, the channel stops are not self-aligning with the active elements.

U.S. Pat. No. 4,013,484 discloses and claims a method of forming channel stops while reducing the number of additional masking steps previously required. In doing so, the referenced patent forms channel stops of opposite conductivity type in the silicon substrate between the first and second spaced apart active regions. However, in practicing the claimed invention, certain deficiencies persist.

For example, in providing a p-well and corresponding channel stops of sufficient width to provide the necessary isolation, the p-type material is driven deeply into the silicon substrate diminishing the utility of the invention in high density applications. As with the prior art, the process disclosed in U.S. Pat. No. 4,013,484 teaches a method for producing channel stop regions which are not self-aligned to the p-well boundary. Further, because of the depth to which the channel stops must be driven to fully isolate the active regions, reduction in source-drain junction breakdown voltage is experienced as well as a corresponding increase in source-drain side wall capacitance.

It is thus an object of the present invention to provide a method for fabricating CMOS transistors without experiencing the difficulties outlined above.

It is yet another object of the present invention to provide a method for fabricating CMOS transistors with self-aligned field regions without employing additional masking steps other than the single masking step used to define the p-well region.

It is yet another object of the present invention to provide a method for fabricating CMOS transistors allowing a minimum space to be used to separate the n- and p-channel transistors.

These and other objects will be more readily appreciated when considering the following disclosure and appended drawings in which:

FIGS. 1-8 sequentially depict the processing steps employed in carrying out the method of the present invention.

DETAILED DESCRIPTION OF THE INVENTION

A novel process for fabricating high density complementary metal-oxide-semiconductor (CMOS) devices is disclosed. These devices are capable of carrying relatively high voltages while the various self-aligned field regions are fabricated without using any additional masking steps other than the mask forming the well-known p-well region. The specific process is disclosed by reference to FIGS. 1-8. By practicing this method, it is possible to fabricate n-channel and p-channel transistors in the same chip or circuit for achieving significant advantages in power consumption as compared to NMOS or bi-polar devices while increasing the chip density above that heretofore achievable.

Turning to FIG. 1, an n-type silicon substrate typically having a resistivity of 0.9 to 1.2 ohms-cm is shown as element 10 over which rests a thin layer of silicon dioxide ($SiO_2$), which can be grown in dry or steam conditions typically to a thickness of approximately 300-500 A. By employing the above-referenced resistivity of the silicon substrate, a short p-channel transistor with masked channel length of 2.5 μm can be made without additional channel implantation. However, other n-type silicon bodies can be employed with various resistivities in practicing the present invention.

After the growth of $SiO_2$ layer 1, a silicon nitride film is deposited preferably within the thickness range of between approximately 1,000-1,500 A in a conventional manner over which is applied photoresist which is exposed and thus hardened in imagewise configuration employing standard photolithographic techniques. Upon a removal of the unhardened areas, the nitride and protective photoresist remain as areas 2 and 3 and 4 and 5, hereinafter referred to as "first and second regions", which will be sites for later configured transistors.

Turning now to FIG. 2, resist 3 and 5 is shown as having been removed to expose nitride areas 2 and 4. Over the entire surface is uniformly grown a field oxide 6 to a thickness approximately above 2,000 A. As will be discussed later in more detail, this oxide serves as a mask against subsequent field implantation. It should also be noted that the field oxide typically does not grow over nitride and, as such, its cross-sectional profile is typified by that shown in FIG. 2.

Layer 7 is next applied over field oxide 6 which can be any material which can be selectively etched either with field oxide 6 or individually while leaving the field oxide intact. As illustrative of the present invention, materials such as LPCVD oxide or VAPOX oxide, as well as metal films such as aluminum films, can be employed generally in a thickness range of between approximately 0.5 μm to 1.0 μm.

In an area surrounding second active region 4, oxide layer 6 is exposed by applying photoresist 9 over etchable layer 7. Typically, exposed region 8 is approximately 10 μm or greater in width and is used for the ion implantation of p-type materials such as boron ions 11. These ions are used to form the p-well region and are generally applied to the surface in doses of approximately $3 \times 10^{12}$ to $1 \times 10^{13}$ ions/cm$^2$ resulting in a p-well bulk concentration after drive-in of approximately $5 \times 10^{15}$ to $2 \times 10^{16}$ ions/cm$^3$. Thereupon, oxide 6 and etchable layer 7 are further removed below photoresist 9 to expose areas 12 as depicted in FIG. 3. These various layers can be removed in any well-known manner, noting that the width of area 12 along silicon body 10 is configured to be equal to approximately the width of the soon to be formed p-well region. As a preferred embodiment, the width of area 12 should be approximately equal to the depth of the later formed p-well junction divided by $\sqrt{2}$. Thus, if the p-well is intended to be configured to a depth of approximately 2 to 7 μm, the width of region 12 would be approximately 1.4 to 5.0 μm.

When p-type impurity 11 was implanted within region 8, it was done at an energy level high enough so that the impurity penetrated nitride layer 4, but the energy level was not high enough to enable the impurity to penetrate oxide layer 7. Thus, all of the p-type impurity was in an area surrounding nitride layer 4, which is then subjected to a drive-in cycle to implant the impurity such as boron ions to define p-well region 13 which, for purposes of illustration, is formed to a depth of between approximately 2 to 7 μm.

It should further be noted in reference to FIG. 4 that etchable layer 7 and photoresist layer 9 can be removed prior to the carrying out of the drive-in cycle, which is preferably performed at temperatures between approximately 1100°-1200° C. At this point, further implantation is carried out preferably with either boron or BF$_2$+ ions 14 at an energy low enough to allow implantation at p-well 13, but not in regions covered by either oxide or nitride, shown in FIG. 5 as regions 4, 2 and 6. Preferably, these later applied dopants are employed in the dose range of approximately $2 \times 10^{12}$ to $8 \times 10^{12}$ ions/cm$^2$.

By following the above-recited sequence, a field implantation has been achieved which is completely self-aligned and defined by the actual boundary established by the p-well lateral diffusion. No secondary masks were required to form elaborate high density channel stops, i.e., at densities of approximately $3 \times 10^{16}$ ions/cm$^3$, the lateral spacing of p-well 13 being somewhat independent of the depth of the p-well, which is in marked contrast to the processes employed by the prior art. As such, the p-well can be doped to increase its field threshold voltage with no additional masking steps other than the single masking step used to form the p-well region itself.

As an optional embodiment, reference is made to FIG. 6 wherein an opposite impurity type 15 such as phosphorus or arsenic ions are uniformly applied to the surface of silicon substrate 10 at an energy level which is high enough to achieve implantation but low enough so that penetration cannot be carried out through nitride layers 2 and 4. Thus, ions 15 are implanted within p-well region 13 and n-type region 16 to enhance the p-field threshold voltage even further.

Referring now to FIG. 7, a second field oxide layer 17 is grown to a thickness of approximately 0.5 to 1.5 μm by, for example, the conventional steam oxidation process. As noted, the oxide does not grow above nitride layers 2 and 4 which are the sites of the later formed active elements. In progressing to FIG. 8, nitride layers 2 and 4 are removed prior to formation of the active devices.

The active devices are fabricated by reference to FIG. 8. A gate oxide 18 and polycrystalline silicon gate electrode 19 are shown disposed above and between source and drain regions 20 and 21 of the n-channel device in p-well 13. The source and drain regions are formed in alignment with gate 19 and field oxide 17.

Further, gate oxide 22 and polysilicon gate electrode 23 for the p-channel device are shown in alignment with the source and drain regions 24 and 25 which are, in turn, formed in alignment with field oxide 17. Leads 27 can then be applied which are isolated by oxide layer 29 and the structure completed by passivation layer 28.

In an attempt to highlight the process of the present invention, it is particularly noted that the ion implantation carried out in conjunction with reference to FIG. 5 is applied uniformly over the surface of the silicon substrate and is thus implanted into the p-well region without any additional masking steps. This implantation virtually completely eliminates weak field regions which appear laterally in prior art p-well containing structures. It further eliminates any weak field inversion regions and thus stray leakage channels from polysilicon or metal electrodes placed atop the active areas. As a further consequence, both the n-channel and p-channel field regions are shown as being self-aligned without using extra masks other than the standard p-well mask shown in FIG. 3.

In the above discussion, a number of details of the presently preferred process such as specific conductivity type, specific impurity, and impurity concentrations have been included to provide a complete disclosure of the present invention. However, as will be appreciated, variations of the described process may be employed, these variations being obvious to one skilled in the art. In some instances, detailed descriptions of well known photolithographic steps have not been included in order not to obscure the inventive process in detail.

We claim:

1. A method of forming complementary metal oxide semiconductor transistors with self-aligned field regions comprising the steps of:
   A. providing on a silicon substrate first and second spaced apart areas for said complementary metal oxide semiconductor transistors, wherein a layer of photoresistive material covers each of said spaced apart areas, said photoresistive layers being substantially coplanar;
   B. forming a masking member on said substrate protecting the first of said areas and exposing the second;
   C. doping the second area with a p-type material;
   D. increasing the size of the unmasked area to a size defining a p-well region surrounding the second area;
   E. forming the p-well region;
   F. doping the p-well region with additional p-type material, thereby defining said self-aligned field regions; and
   G. fabricating complementary metal oxide semiconductor transistors in said first and second spaced apart areas.

2. The method of claim 1 wherein said first and second spaced apart areas are in part covered by silicon nitride prior to forming said masking member, said silicon nitride is positioned below said photoresistive layers.

3. The method of claim 2 wherein a field oxide is formed on the silicon substrate after applying said silicon nitride.

4. The method of claim 1 further comprising the step of substantially uniformly doping the silicon substrate with n-type material prior to fabricating said complementary metal oxide semiconductor transistors.

5. The method of claim 4 wherein the uniformly applied p-type material is selected from the group consisting of phosphorus and arsenic ions.

6. The method of claim 1 wherein said p-well is formed to a depth of approximately 2 $\mu$m to 7 $\mu$m.

7. The method of claim 1 wherein said silicon substrate comprises an n-type silicon having a resistivity between approximately 0.9 to 1.2 ohm-cm.

8. A method of forming complementary metal oxide semiconductor transistors with self-aligned field regions comprising the steps of:
   A. providing on a silicon substrate first and second spaced apart areas;
   B. selectively applying silicon nitride to said first and second areas;
   C. applying a field oxide over said silicon substrate;
   D. applying an etchable material over said field oxide;
   E. selectively etching said etchable material to expose the oxide and nitride in said second area;
   F. doping the exposed second area with a p-type material;
   G. further etching said etchable material to a size defining a p-well region surrounding said second area;
   H. forming the p-well region;
   I. removing substantially all of the remaining etchable material;
   J. uniformly applying p-type material to the substrate which passes into the substrate in the p-well region but not in regions covered with oxide and silicon nitride; and
   K. fabricating complementary metal oxide semiconductor transistors in said first and second spaced apart areas.

9. The method of claim 8 further comprising the steps of:
   A. removing the field oxide after the uniform application of the p-type material to the substrate followed by,
   B. uniformly applying n-type material to the surface of the substrate.

10. The method of claim 8 wherein said etchable material is a member selected from the group consisting of low pressure chemical vapor deposition oxide, vapor phase phosphosilicate oxide oxide and metal.

11. The method of claim 10 wherein said metal is aluminum.

12. The method of claim 8 wherein said etchable material is formed to a thickness between approximately 0.5$\mu$ to 1.0$\mu$.

13. The method of claim 8 wherein said p-well region is formed to a width approximately equal to its depth divided by $\sqrt{2}$.

* * * * *